United States Patent
You et al.

(10) Patent No.: US 10,283,675 B2
(45) Date of Patent: May 7, 2019

(54) VERTICAL LIGHT EMITTING DIODE HAVING ELECTRODE CONFIGURATION AND LIGHT EMITTING DIODE PACKAGE HAVING THE SAME

(71) Applicant: Seoul Viosys Co., Ltd., Ansan-si (KR)

(72) Inventors: Jong Kyun You, Ansan-si (KR); Byoung Kyu Park, Ansan-si (KR); Chang Yeon Kim, Ansan-si (KR); Chae Hon Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 8 days.

(21) Appl. No.: 15/623,375

(22) Filed: Jun. 14, 2017

(65) Prior Publication Data
US 2017/0365743 A1    Dec. 21, 2017

(30) Foreign Application Priority Data
Jun. 16, 2016   (KR) .......................... 10-2016-0075286

(51) Int. Cl.
*H01L 33/38* (2010.01)
*H01L 33/22* (2010.01)
(Continued)

(52) U.S. Cl.
CPC .............. *H01L 33/38* (2013.01); *H01L 33/22* (2013.01); *H01L 33/44* (2013.01); *H01L 33/486* (2013.01);
(Continued)

(58) Field of Classification Search
CPC .......... H01L 33/38; H01L 33/60; H01L 33/08; H01L 33/501; H01L 33/22; H01L 33/62; H01L 33/486; H01L 33/44
See application file for complete search history.

(56) References Cited

U.S. PATENT DOCUMENTS

2004/0257797 A1* 12/2004 Suehiro ................. H01L 33/507
362/34
2006/0049422 A1*  3/2006 Shoji ..................... H01L 33/486
257/100
(Continued)

FOREIGN PATENT DOCUMENTS

WO    WO 2013085255    *  6/2013

*Primary Examiner* — Ahmed N Sefer
(74) *Attorney, Agent, or Firm* — H.C. Park & Associates, PLC

(57) ABSTRACT

A light emitting diode including a semiconductor stack including a lower semiconductor layer, an active layer, and an upper semiconductor layer; an upper electrode connected to the upper semiconductor layer and including an electrode pad and extensions extending from the electrode pad; and a lower electrode connected to the lower semiconductor layer. The electrode pad includes a first electrode pad having an elongated shape, disposed along a first side of the upper semiconductor layer, and covering the upper semiconductor layer near the first side of the upper semiconductor layer, and the extensions include an edge extension extending along an edge of the upper semiconductor layer in the electrode pad and surrounding a luminous region and middle extensions extending from the edge extension or the electrode pad and dividing the luminous region into a plurality of luminous regions.

22 Claims, 9 Drawing Sheets

(51) Int. Cl.
   *H01L 33/44*   (2010.01)
   *H01L 33/48*   (2010.01)
   *H01L 33/50*   (2010.01)
   *H01L 33/60*   (2010.01)
   *H01L 33/62*   (2010.01)
   H01L 33/08    (2010.01)

(52) U.S. Cl.
   CPC ............ *H01L 33/501* (2013.01); *H01L 33/60* (2013.01); *H01L 33/62* (2013.01); H01L 33/08 (2013.01); H01L 33/387 (2013.01); H01L 33/505 (2013.01); H01L 2224/48091 (2013.01); H01L 2224/48227 (2013.01); H01L 2224/49175 (2013.01)

(56) References Cited

U.S. PATENT DOCUMENTS

| | | | | |
|---|---|---|---|---|
| 2010/0181887 A1* | 7/2010 | Baek | ............... | G02B 6/0023 |
| | | | | 313/45 |
| 2012/0175662 A1* | 7/2012 | Min | ............... | H01L 33/38 |
| | | | | 257/99 |
| 2013/0001605 A1* | 1/2013 | Ishihara | ............... | H01L 33/505 |
| | | | | 257/88 |
| 2014/0061709 A1* | 3/2014 | Suh | ............... | H01L 33/44 |
| | | | | 257/98 |
| 2014/0117389 A1* | 5/2014 | Lee | ............... | H01L 33/38 |
| | | | | 257/98 |
| 2014/0117403 A1* | 5/2014 | Hayashi | ............... | H01L 33/62 |
| | | | | 257/99 |
| 2014/0145633 A1* | 5/2014 | Seo | ............... | H01L 33/486 |
| | | | | 315/200 R |
| 2014/0166976 A1* | 6/2014 | Im | ............... | H01L 33/40 |
| | | | | 257/13 |
| 2014/0183574 A1* | 7/2014 | Nakabayashi | ............... | H01L 33/62 |
| | | | | 257/88 |
| 2014/0217448 A1* | 8/2014 | Kim | ............... | H01L 33/405 |
| | | | | 257/98 |
| 2014/0225139 A1* | 8/2014 | Park | ............... | H01L 33/62 |
| | | | | 257/98 |
| 2015/0124455 A1* | 5/2015 | Tamura | ............... | H01L 25/0753 |
| | | | | 362/293 |
| 2015/0171271 A1* | 6/2015 | Inoue | ............... | H01L 33/38 |
| | | | | 257/98 |
| 2015/0349224 A1* | 12/2015 | Ichihara | ............... | H01L 33/62 |
| | | | | 257/89 |
| 2016/0072031 A9* | 3/2016 | Choi | ............... | H01L 33/38 |
| | | | | 257/98 |
| 2016/0240746 A1* | 8/2016 | Yun | ............... | H01L 33/56 |

* cited by examiner

VERTICAL LIGHT EMITTING DIODE HAVING ELECTRODE CONFIGURATION AND LIGHT EMITTING DIODE PACKAGE HAVING THE SAME

CROSS-REFERENCE TO RELATED APPLICATION

This application claims priority from and the benefit of Korean Patent Application No. 10-2016-0075286, filed on Jun. 16, 2016, which is hereby incorporated by reference for all purposes as if fully set forth herein.

BACKGROUND

Field

Exemplary embodiments relate to a light emitting diode. More particularly, exemplary embodiments relate to a vertical light emitting diode having an electrode configuration.

Discussion of the Background

A vertical light emitting diode having a growth substrate removed therefrom is used in various fields. Particularly, the vertical light emitting diode is capable of emitting light with high output. As such, a vertical light emitting diode has recently been utilized in projectors or headlamps for vehicles.

A vertical light emitting diode is generally packaged through a packaging process. A light emitting diode package includes a wavelength converter, which may be formed by mixing phosphors in a resin, such as a silicone or epoxy resin, to convert blue light or ultraviolet (UV) light emitted from a light emitting diode into visible light having a long wavelength.

Since a projector or a headlamp for vehicles emits light with high output in a closed space, its surrounding temperature may be increased significantly. Thus, a light emitting diode package used in these fields is required to have good heat dissipation characteristics and high temperature durability. However, a conventional wavelength converter formed by mixing the phosphors in a resin, such as a silicone or epoxy resin, is sensitive to temperature and may not be suitable for headlamps for vehicles and the like. Therefore, there is a need for a novel light emitting diode package having high temperature durability.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a vertical light emitting diode, which allows a wavelength converter having high temperature durability to be easily coupled thereto, and a light emitting diode package including the same.

Additional aspects will be set forth in the detailed description which follows, and, in part, will be apparent from the disclosure, or may be learned by practice of the inventive concept.

According to an exemplary embodiment, a light emitting diode includes a semiconductor stack including a lower semiconductor layer, an active layer, and an upper semiconductor layer, an upper electrode connected to the upper semiconductor layer and including an electrode pad and extensions extending from the electrode pad, and a lower electrode connected to the lower semiconductor layer, in which the electrode pad includes a first electrode pad having an elongated shape, disposed along a first side of the upper semiconductor layer, and covering the upper semiconductor layer near the first side of the upper semiconductor layer, and the extensions include an edge extension extending along an edge of the upper semiconductor layer in the electrode pad and surrounding a luminous region and middle extensions extending from the edge extension or the electrode pad and dividing the luminous region into a plurality of luminous regions.

According to an exemplary embodiment, a light emitting diode package includes a base substrate including a first electrode and a second electrode, a light emitting diode mounted on the base substrate and electrically connected to the first electrode and the second electrode, a wavelength converter mounted on the light emitting diode, a housing disposed on the base substrate and surrounding the light emitting diode, and an encapsulation portion covering the light emitting diode within the housing and exposing an upper surface of the wavelength converter. The light emitting diode includes a semiconductor stack including a lower semiconductor layer, an active layer, and an upper semiconductor layer, an upper electrode connected to the upper semiconductor layer and including an electrode pad and extensions extending from the electrode pad, a lower electrode connected to the lower semiconductor layer. The electrode pad includes a first electrode pad having an elongated shape, disposed along a first side of the upper semiconductor layer, and covering the upper semiconductor layer near the first side of the upper semiconductor layer and the extensions include an edge extension extending along an edge of the upper semiconductor layer in the electrode pad and surrounding a luminous region, and middle extensions extending from the edge extension or the electrode pad and dividing the luminous region into a plurality of luminous.

According to exemplary embodiments, a light emitting diode may include an electrode pad having a shape that may easily adapt a phosphor-in-glass (PIG) having high temperature durability to be attached thereto. In addition, exemplary embodiments provide a light emitting diode package having high temperature durability using the light emitting diode having the PIG mounted thereon.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1A:
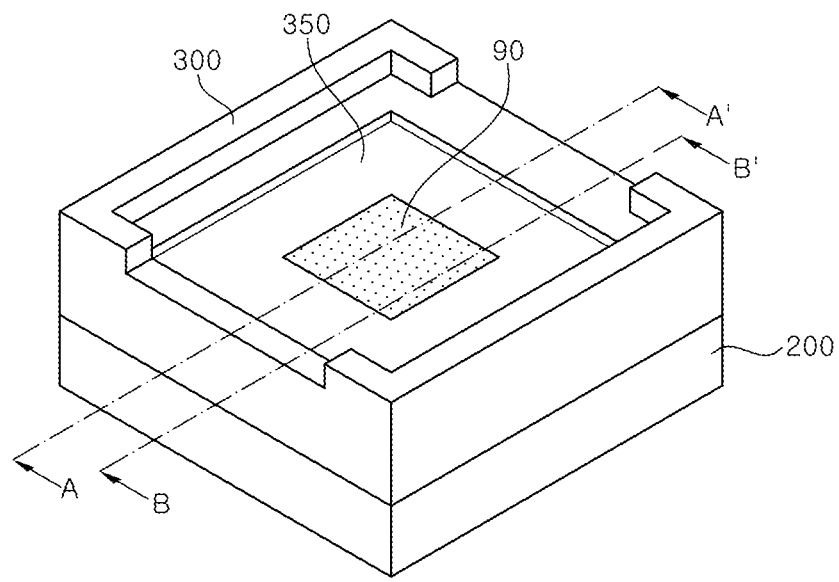
FIG. 1A, FIG. 1B and, FIG. 1C show a schematic perspective view, a cross-sectional view, and a cross-sectional perspective view of a light emitting diode package according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1B:
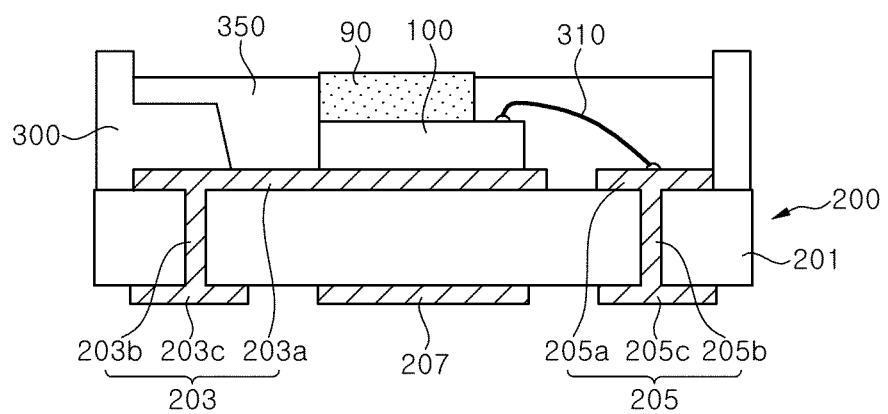
Figure 1C:
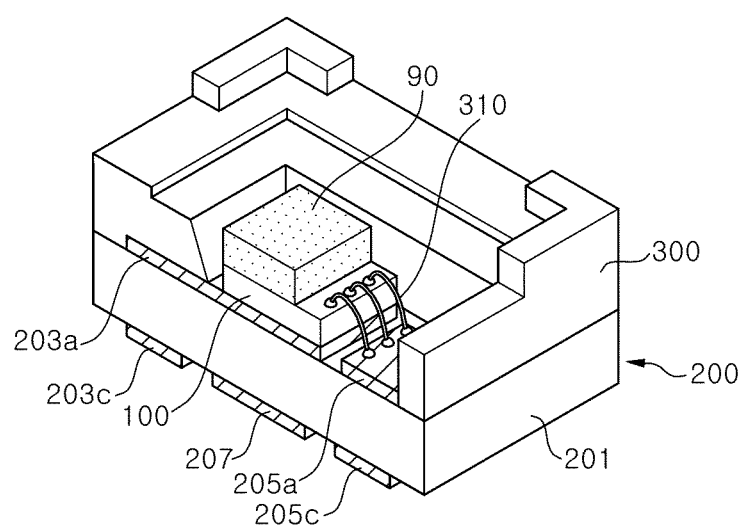

FIG. 1A is a perspective view of a light emitting diode package according to an exemplary embodiment, FIG. 1B is a cross-sectional view taken along line A-A' of FIG. 1A, and FIG. 1C is a partially cut-away perspective view taken along line B-B' of FIG. 1A.

Referring to FIGS. 1A, 1B, and 1C, the light emitting diode package according to an exemplary embodiment includes a light emitting diode 100, a wavelength converter 90, a base substrate 200, a housing 300, and bonding wires 310.

The base substrate 200 includes an insulating substrate 201, a first electrode 203 and a second electrode 205, and may further include a heat dissipation pad 207. The insulating substrate 201 may be a ceramic substrate, for example, an aluminum nitride (AlN) substrate. The AlN substrate is durable at high temperature and has good heat dissipation characteristics.

The first electrode 203 and the second electrode 205 include upper leads 203a and 205a, lower leads 203c and 205c, and vias 203b and 205b, respectively. The upper leads 203a and 205a are disposed on an upper surface of the insulating substrate 201. The lower leads 203c and 205c are disposed on a lower surface of the insulating substrate 201, and the vias 203b and 205b are formed through the insulating substrate 201 to connect the upper leads 203a and 205a to the lower leads 203c and 205c, respectively.

According to an exemplary embodiment, the first and second electrodes 203 and 205 may have a multilayer structure, for example, a multilayer structure of Ni/Cu/Au layers. The Ni layer may improve adhesion of electrode patterns to the AlN substrate, and the Au layer may prevent oxidation of the Cu layer and improve adhesion to the light emitting diode 100 described below. In addition, the Cu layer may promote current and heat transfer, and may have a greater thickness than the Ni layer and the Au layer. However, layers included in the first and second electrodes 203 and 205 are not limited to these metal layers.

The heat dissipation pad 207 is disposed between the first and second lower leads 203c and 205c, and is electrically insulated from the first and second lower leads 203c and 205c. The heat dissipation pad 207 may facilitate heat dissipation through contact with metal or a printed circuit board (PCB), for example, a metal PCB. The heat dissipation pad 207 may include the same material as those of the first and second electrodes 203 and 205.

The light emitting diode 100 is disposed on the upper lead 203a, and is electrically connected to the upper lead 205a through the bonding wires 310. A plurality of bonding wires 310 may be bonded to one electrode pad 80a (see FIG. 2B) of the light emitting diode 100. Although FIG. 1C illustrates three bonding wires 310 connected to the electrode pad, the number of bonding wires may be varied without being limited thereto. The light emitting diode 100 may have a vertical structure, which will be described in more detail below.

The wavelength converter 90 is mounted on the light emitting diode 100. The wavelength converter 90 may be attached to the light emitting diode 100 via a bonding material, such as silicone. The wavelength converter 90 may cover a portion of an upper surface of the light emitting diode 100. The wavelength converter 90 may be a rigid plate, such as a phosphor-in-glass (PIG) wavelength converter. The wavelength converter 90 may have a rectangular shape and cover a region of the light emitting diode 100. The wavelength converter 90 may be used after dividing a large plate into discrete parts. When the wavelength converter 90, such as a PIG, has a complicated shape, individual division of the large plate would increase manufacturing complexity. However, the wavelength converter 90 according to an exemplary embodiment may have a rectangular shape, for example, a square shape, and thus, may reduce manufacturing process during the division process.

The housing 300 surrounds the light emitting diode 100. The housing 300 may be formed of a different material with respect to the insulating substrate 201, for example, a silicone molding compound. The housing 300 includes a cavity for accommodating an encapsulation portion 350. The housing 300 has openings at upper and lower sides thereof, and the base substrate 200 is disposed on the bottom of the housing 300. Further, the housing 300 may be formed to surround, for example, the light emitting diode 100, and may having openings at some sides thereof.

The housing 300 may have different widths depending upon location. As used herein, a width may be referred to a distance measured along a direction parallel to a top surface of the based substrate 200. Particularly, since the upper lead 205a for connection of the bonding wires 310 is disposed in a restricted region, a portion of the housing 300 near the upper lead 205a may have a relatively smaller width. Further, at least part of an inner wall of the housing 300 may be inclined, such that the width of the housing gradually increases downwards.

The encapsulation portion 350 fills the cavity of the housing 300 and covers the light emitting diode 100. The encapsulation portion 350 exposes an upper surface of the wavelength converter 90, while covering four sides of the light emitting diode 100 and a portion of the upper surface of the light emitting diode 100 on which the wavelength converter 90 is not formed. The encapsulation portion 350 covers the bonding wires 310, such that only the wavelength converter 90 can be seen in a plan view of the package.

The encapsulation portion 350 may be formed as a white reflector. For example, the encapsulation portion 350 may include a mixture of a white pigment and a resin, such as a silicone resin or an epoxy resin. Further, polycarbonate or a reflector, such as PCT, may be used as a material for the encapsulation portion 350.

In an exemplary embodiment, the encapsulation portion 350 may be opaque. As such, light emitted from the light emitting diode 100 may be discharged to the outside of the package through the wavelength converter 90. Accordingly, the light emitting diode package according to an exemplary embodiment may control emission of light through a wavelength conversion of light and a light emission direction.

Although not shown, the light emitting diode package may further include a protection device, for example, a Zener diode, therein.

Figure 2A:
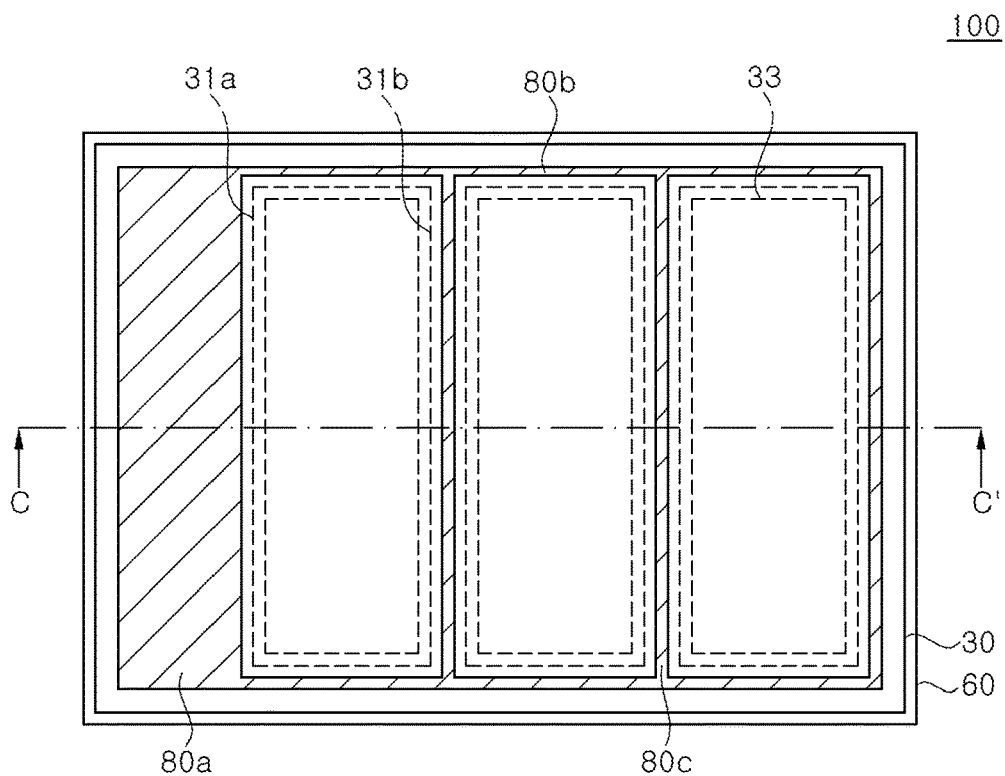
FIG. 2A and FIG. 2B show a schematic plan view and a cross-sectional view of a light emitting diode according to an exemplary embodiment.

Next, the light emitting diode 100 will be described in detail. FIG. 2A is a plan view of a light emitting diode according to an exemplary embodiment, and FIG. 2B is a cross-sectional view taken along line C-C' of FIG. 2A.

Figure 2B:
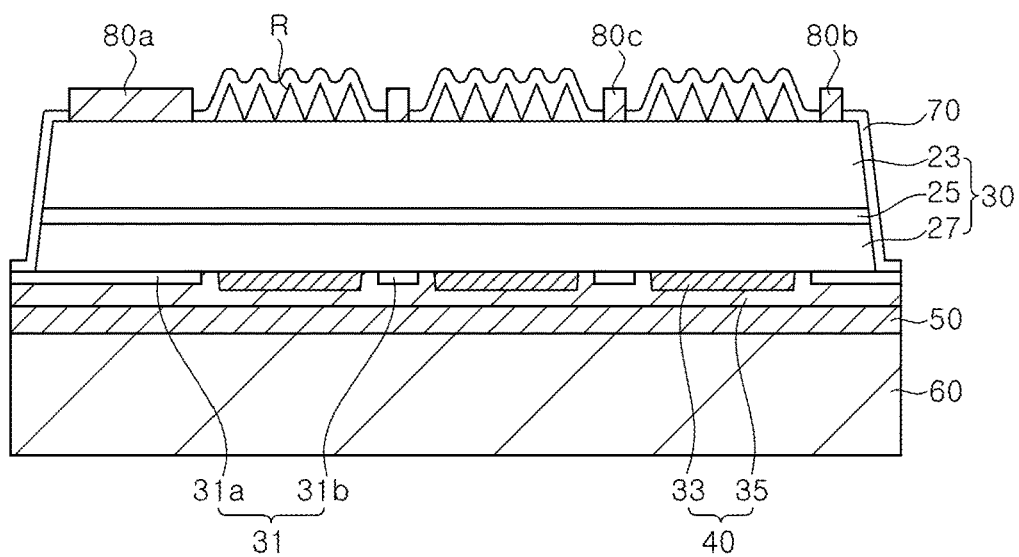

Referring to FIG. 2A and FIG. 2B, the light emitting diode 100 according to an exemplary embodiment includes a light emitting structure 30, a lower electrode 40, and an upper electrode. The upper electrode may include, for example, an electrode pad 80a and extensions 80b and 80c. The light emitting diode 100 may further include a support substrate 60, a bonding metal layer 50, a current blocking layer 31, and a passivation layer 70.

The support substrate 60 is disposed at a lower side of the light emitting structure 30 and support the light emitting structure 30. The support substrate 60 has conductivity and may be used as an electrode pad. The support substrate 60 may include, for example, a metallic material having electrical conductivity. The support substrate 60 may include, for example, Mo, Cu, Ag, Au, Ni, Ti, Al, and the like, and may be composed of a single layer or multiple layers, without being limited thereto. Alternatively, the support substrate 60 may be an insulating substrate.

The light emitting structure 30 is disposed on an upper side of the support substrate 60. The light emitting structure 30 may include an upper semiconductor layer 23 and a lower semiconductor layer 27, which have different conductivities from each other. The light emitting structure 30 may further include an active layer 25 interposed between the upper semiconductor layer 23 and the lower semiconductor layer 27. The active layer 25 and the upper and lower semiconductor layers 23 and 27 may include Group III-V based compound semiconductors, for example, a nitride semiconductor such as (Al, Ga, In)N. The upper semiconductor layer 23 may include n-type dopants (for example, Si) to exhibit n-type conductivity and the lower semiconductor layer 27 may include p-type dopants (for example, Mg) to exhibit p-type conductivity. The n-type upper semiconductor layer 23 may be disposed on the active layer 25, which may be disposed on the p-type lower semiconductor layer 27.

After growth on a growth substrate, the light emitting structure 30 may be separated from the growth substrate. In this case, the upper semiconductor layer 23, the active layer 25, and the lower semiconductor layer 27 may be sequentially formed on the growth substrate. Alternatively, the upper semiconductor layer 23 may include a portion of the growth substrate.

The growth substrate may be selected from any substrates, on which a nitride semiconductor layer can be grown and has electrical conductivity. When the growth substrate is an insulating substrate, the growth substrate may be separated from the light emitting structure 30 by a laser lift-off process and the like. On the other hand, when the growth substrate is a silicon carbide substrate, a gallium nitride substrate, or an aluminum nitride substrate, at least part of these growth substrates may be remained on the light emitting structure 30.

The growth substrate may have a polar, non-polar, or semi-polar growth plane. Accordingly, a polarity of each of the upper semiconductor layer 23, the active layer 25, and the lower semiconductor layer 27 grown on the growth substrate may be determined depending upon the polarity of the growth substrate.

An upper surface of the light emitting structure 30 may have a roughened surface R or a high roughness surface, as shown in FIG. 2B. As used herein, the roughened surface may refer to the surface being further roughened by certain physical or chemical treatment. The roughened surface R may be formed by at least one of wet etching and electrochemical etching, for example, PEC etching, or may be formed by an etching process using an etching solution containing KOH and NaOH.

Alternatively, the roughened surface R may be formed by dry etching. For example, the roughened surface R may be formed by dry etching, using a $SiO_2$ layer as an etching mask. In an exemplary embodiment, a $SiO_2$ layer may be formed on the upper surface of the light emitting structure 30 by PECVD, and is subjected to patterning by photolithography to form an etching mask. Then, the roughened surface R may be formed by partially dry etching the light emitting structure 30 through the etching mask. In an exemplary embodiment, a patterned photo-mask may be formed on the light emitting structure 30, and a $SiO_2$ layer may be formed to cover the photo-mask and the upper surface of the light emitting structure 30. The light emitting structure 30 may be patterned by lifting-off the photo-mask, and partially dry etching the light emitting structure 30 through the patterned $SiO_2$ layer used as an etching mask to form protrusions.

Alternatively, the roughened surface R may be formed using metal particles as the etching mask. In exemplary embodiments, the etching masks are formed by different methods and have different shapes depending upon the mask formation methods. The shapes of the protrusions formed on the roughened surface R may differ depending upon the shape of the etching mask.

The $SiO_2$ layer used as the etching mask may improve light extraction efficiency as compared to using the photoresist alone.

The current blocking layer 31 prevents electric current from the upper electrode from flowing vertically downwards under the upper electrode, thereby allowing the electric current to spread over a wide area of the light emitting structure 30. As such, the current blocking layer 31 is formed on a lower surface of the lower semiconductor layer 27 to overlap upper electrodes 80a, 80b, and 80c. In addition, the current blocking layer 31 may be formed to have a larger width than each of the corresponding upper electrodes 80a, 80b, and 80c. Particularly, a portion of the current blocking layer 31 disposed near an edge of the light emitting structure 30 may protrude from the light emitting structure 30. For example, a side surface of the current blocking layer 31 may be parallel to a side surface of the support substrate 60, as shown in FIG. 2B.

The current blocking layer 31 may include an insulating material, for example, $SiO_2$ or $Si_3N_4$. Furthermore, the current blocking layer 31 may be formed by repeatedly stacking insulating layers having different refraction indices, and may constitute a distributed Bragg reflector (DBR).

The lower electrode 40 may be electrically connected to the lower semiconductor layer 27. The lower electrode 40 is disposed on the lower surface of the light emitting structure 30 and, particularly, may contact the lower surface of the light emitting structure 30. The lower electrode 40 may include a reflective layer 33 and a cover layer 35.

The reflective layer 33 may form ohmic contact with the lower semiconductor layer 27. The reflective layer 33 may reflect light and function as an electrode electrically connected to the light emitting structure 30. The reflective layer may include at least one metal layer of Ni, Pt, Pd, Rh, W, Ti, Al, Mg, Ag, and Au. Furthermore, the reflective layer 33 may include a distributed Bragg reflector (DBR). The reflective layer 33 may be divided into a plurality of regions by the current blocking layer 31.

The cover layer 35 may be formed to cover the reflective layer 33 and may prevent inter-diffusion of different materials than the reflective layer 33. The cover layer 35 may also cover the current blocking layer 31. The cover layer 35 may include, for example, Au, Ni, Ti, Cr, Pt, W, and the like, and may be composed of a single layer or multiple layers. The cover layer 35 may contact the lower semiconductor layer 27 in some regions between the current blocking layers 31a and 31b, and the reflective layer 33. Particularly, the cover layer 35 may include Al having high reflectivity and may form Schottky contact in some regions between the current blocking layer 31 and the reflective layer 33.

The bonding metal layer 50 bonds the support substrate 60 to the lower electrode 40. For example, the lower electrode 40 and the support substrate 60 may be bonded to each other by eutectic bonding using AuSn, and thus, the bonding metal layer 50 may include AuSn.

The upper electrode is electrically connected to the upper semiconductor layer 23. The upper electrode includes the electrode pad 80a, a middle extension 80c, and an edge extension 80b. The electrode pad 80a has a relatively broader area for wire bonding. Particularly, in exemplary embodiments, the electrode pad 80a has an elongated shape and is disposed along one side of the upper semiconductor layer 23 and covers the upper semiconductor layer 23 near the one side thereof, as shown in FIG. 2A. A plurality of bonding wires 310 may be bonded to the electrode pad 80a (see FIG. 1). The electrode pad 80a may have a constant width. Thus, portions of the electrode pad 80a bonded to each bonding wire 310 may have substantially the same interval.

The electrode pad 80a may be formed to have a length of three quarters or more to the length of the one side of the upper semiconductor layer 23. The electrode pad 80a may be accurately coincident with the one side of the upper semiconductor layer 23, without being limited thereto. Some region between the one side of the upper semiconductor layer 23 and the electrode pad 80a may be exposed.

The structure of the electrode pad 80*a* having an elongated shape allows the plurality of bonding wires to be connected to the electrode pad 80*a*, which prevents the wires from being disconnected to the light emitting diode 100 in high current applications, thereby improving reliability of the light emitting diode 100. Furthermore, the structure of the electrode pad 80*a* having an elongated shape allows main luminous regions to be formed in a rectangular shape.

The edge extension 80*b* extends from the electrode pad 80*a* along edges of the upper semiconductor layer 23, and the middle extension 80*c* extends from the edge extension 80*b* to divide the luminous region into plural regions. Although the luminous region is illustrated as being divided into three luminous regions in FIG. 2A, the number of luminous regions may be varied without being limited thereto. The edge extension 80*b* and the middle extension 80*c* may distribute carriers to assist in current spreading.

The upper electrode 80*a*, 80*b*, and 80*c* may be formed in a flat region formed by etching, upon formation of the roughened surface R. As shown in FIG. 2B, protrusions on the roughened surface R formed by etching may have a greater height than the electrode pad 80*a* or the extensions 80*b* and 80*c*. However, the upper electrode may alternatively have a greater height than the protrusions, and may be formed on the roughened surface R. In a light emitting diode configured to operated under high current density, a droop phenomenon and luminous efficacy may be further improved with increasing distance between the upper electrode 80*a*, 80*b*, and 80*c* and the active layer 25. On the other hand, current spreading may be further improved with decreasing distance between the upper electrode 80*a*, 80*b*, and 80*c* and the active layer 25. Accordingly, the location of the upper electrode 80*a*, 80*b*, and 80*c* may be adjusted in consideration of drive current of the light emitting diode.

The upper electrode may be composed of a single layer or multiple layers, and may include Ni, W, Pt, Cu, Ti, Pd, Ta, Au, Ag, Al, Sn, and the like. For example, the upper electrode 80 may include metal layers composed of multiple layers, such as Ti/Al, Ni/Al, Cr/Al, or Pt/Al layers, and may further include a layer including Ni, W, Pt, Cu, Ti, Pd, Ta, or Au, and formed on the multiple layers to prevent agglomeration of Al.

The passivation layer 70 may partially cover upper and side surfaces of the light emitting structure 30. The passivation layer 70 protects the light emitting structure 30 from an exterior environment. The passivation layer 70 may be formed of an insulating material and may be composed of a single layer or multiple layers. For example, the passivation layer 70 may include $SiO_2$, $SiN_x$, and the like.

The passivation layer 70 may cover the current blocking layer 31 protruding from the light emitting structure 30. Accordingly, the current blocking layer 31 overlaps the passivation layer 70 outside the light emitting structure 30. Accordingly, the overall thickness of the insulating layers (the current blocking layer 31 and the passivation layer 70) disposed on the cover layer 35 outside the light emitting structure 30 may be greater than the thickness of the insulating layer (current blocking layer 31) disposed on the cover layer 35 under the light emitting structure 30.

Figure 3A:
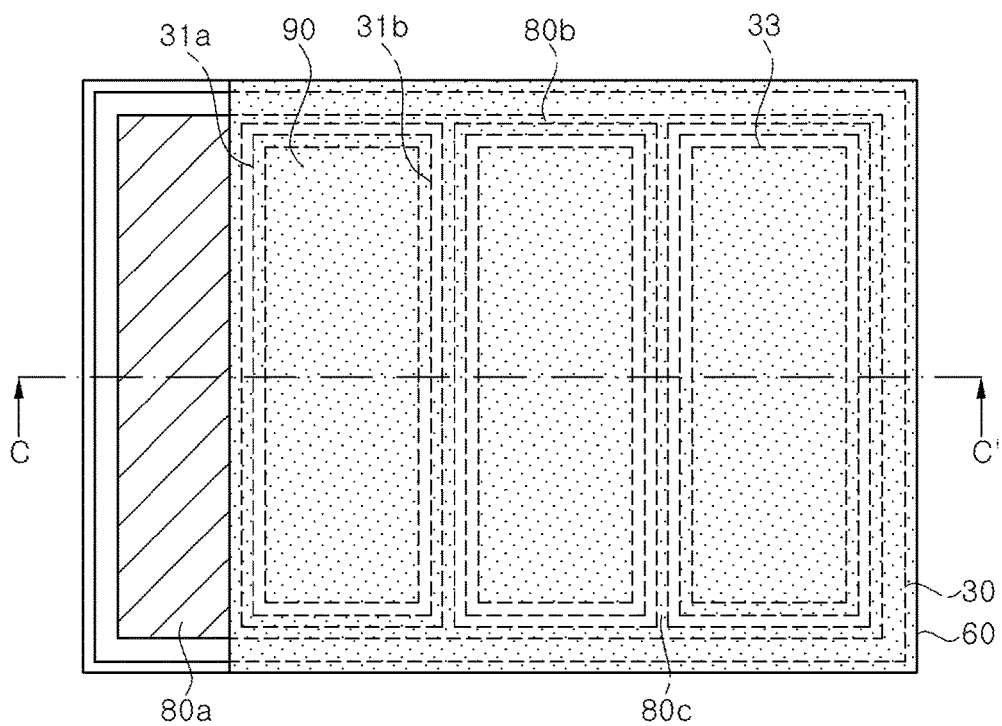
FIG. 3A and FIG. 3B show a schematic plan view and a cross-sectional view of a light emitting diode according to an exemplary embodiment, on which a wavelength converter is mounted.
Figure 3B:
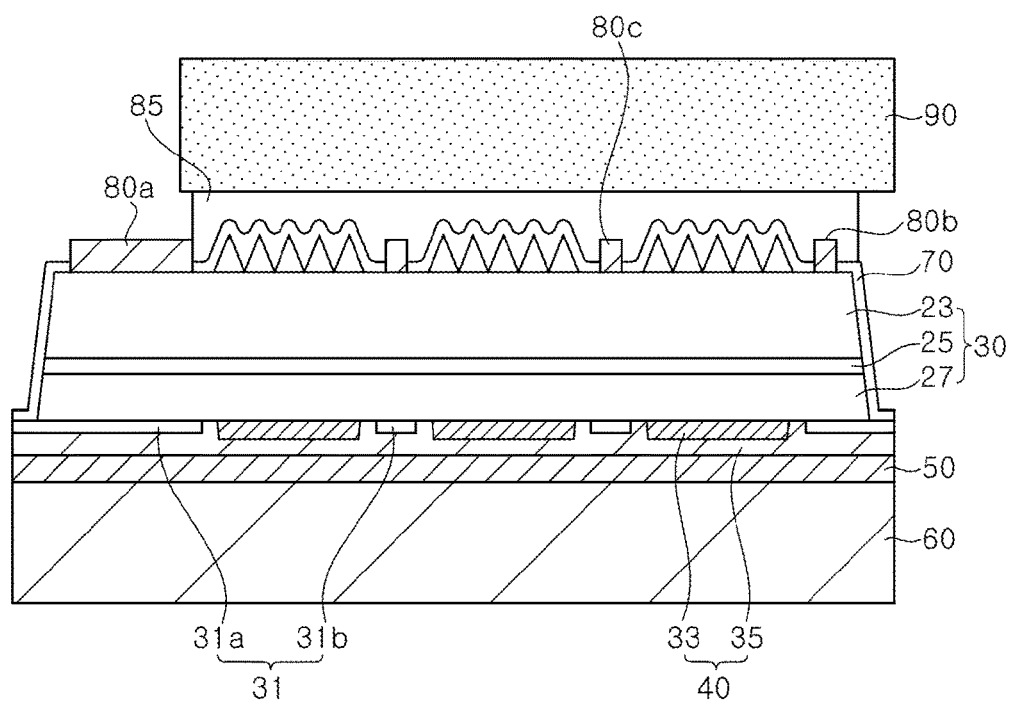

FIG. 3A is a schematic plan of the light emitting diode according to an exemplary embodiment, on which a wavelength converter is mounted, and FIG. 3B is a cross-sectional view taken along line C-C' of FIG. 3A.

Referring to FIG. 3A and FIG. 3B, the wavelength converter 90 is mounted on the light emitting diode 100 shown in FIGS. 2A and 2B. The wavelength converter 90 may include phosphors contained in a medium having thermal resistance, for example, PIG (phosphor-in-glass). PIG can be used for a long period of time without deterioration, discoloration, or cracking in high temperature environments. The wavelength converter 90 may have a rectangular shape, for example, a square shape. Thus, the wavelength converter 90 may be formed in a simple shape using a rigid material, such as PIG, through a simple process.

Since the electrode pad 80*a* is disposed in an elongated shape along one side (or edge) of the upper semiconductor layer 23, the wavelength converter 90 covers a rectangular region between the electrode pad 80*a* and the other side of the upper semiconductor layer 23. Particularly, the wavelength converter 90 may have a greater width than the upper semiconductor layer 23 in a direction of the one side of the upper semiconductor layer 23 and the region between the electrode pad 80*a* and the other opposing side of the upper semiconductor layer 23. Accordingly, the electrode pad 80*a* may cover all of other sides of the upper semiconductor layer 23 excluding the one side of the upper semiconductor layer 23. Furthermore, a portion of the wavelength converter 90 may overlap a portion of the electrode pad 80*a*. Accordingly, the light emitting diode 100 according to an exemplary embodiment may minimize emission of light generated in the active layer 25 without wavelength conversion. However, it should be understood that other implementations are also possible.

The wavelength converter 90 may be attached to the light emitting diode 100 via a transparent bonding member 85. For example, the transparent bonding member 85 may be formed of a silicone or epoxy resin.

Figure 4A:
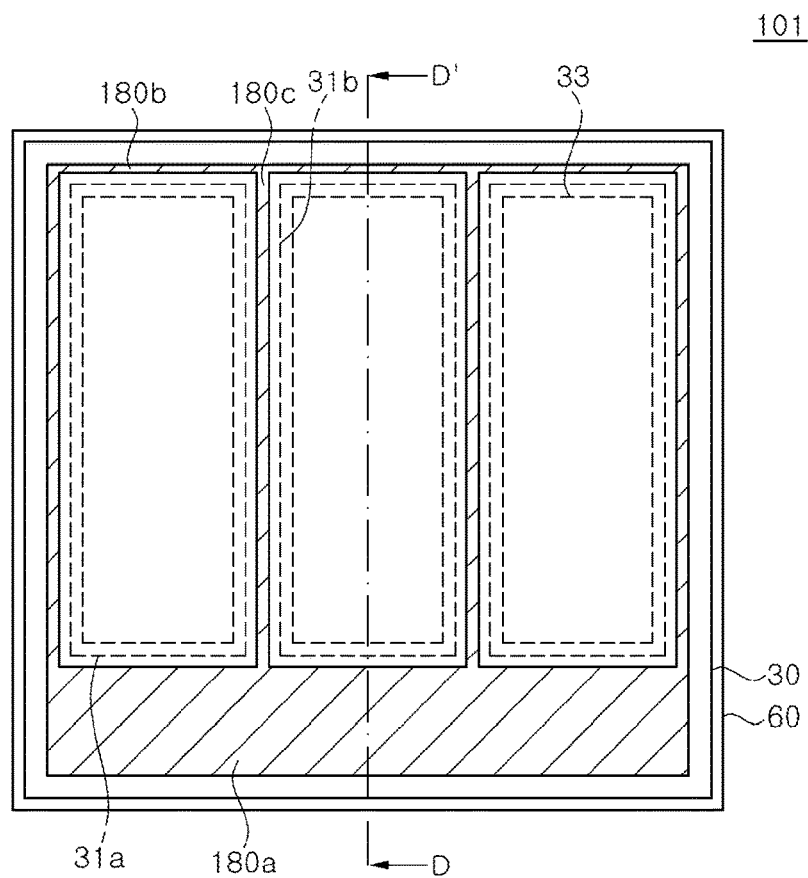
FIG. 4A and FIG. 4B are a schematic plan view and a cross-sectional view of a light emitting diode according to an exemplary embodiment.
Figure 4B:
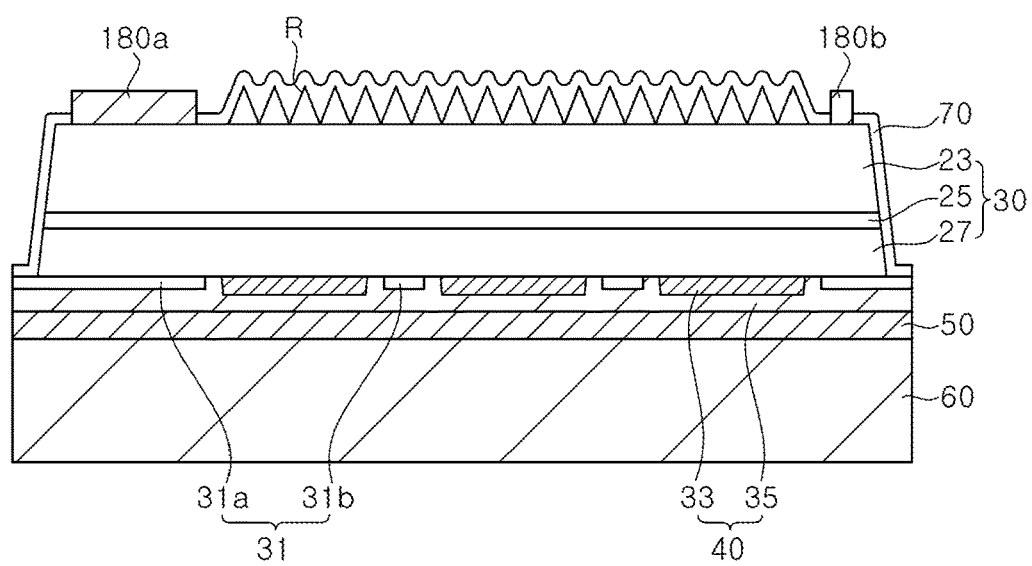

FIG. 4A is a schematic plan of a light emitting diode according to an exemplary embodiment, and FIG. 4B is a cross-sectional view taken along line D-D' of FIG. 4A.

Referring to FIG. 4A and FIG. 4B, a light emitting diode 101 according to an exemplary embodiment is generally similar to the light emitting diode 100 described with reference to FIGS. 2A and 2B, except for the arrangement of an electrode pad 180*a*, an edge extension 180*b*, and a middle extension 180*c*. More particularly, the middle extension 180*c* connects the electrode pad 180*a* to the edge extension 180*b*, and divides luminous regions. Thus, the luminous regions are disposed perpendicular to the electrode pad 180*a*. In this arrangement, the location of the middle extension 180*c* is changed to overlap the current blocking layer 31*b* or the middle extension 180*c*, and the reflective layer 33 is disposed in a region surrounded by the current blocking layer 31*b* and is perpendicular to the electrode pad 180*a*.

The electrode pad 180*a* has an elongated shape along one side of the upper semiconductor layer 23. Thus, as described with reference to FIGS. 3A and 3B, a rectangular wavelength converter 90 may cover the luminous regions.

Figure 5:
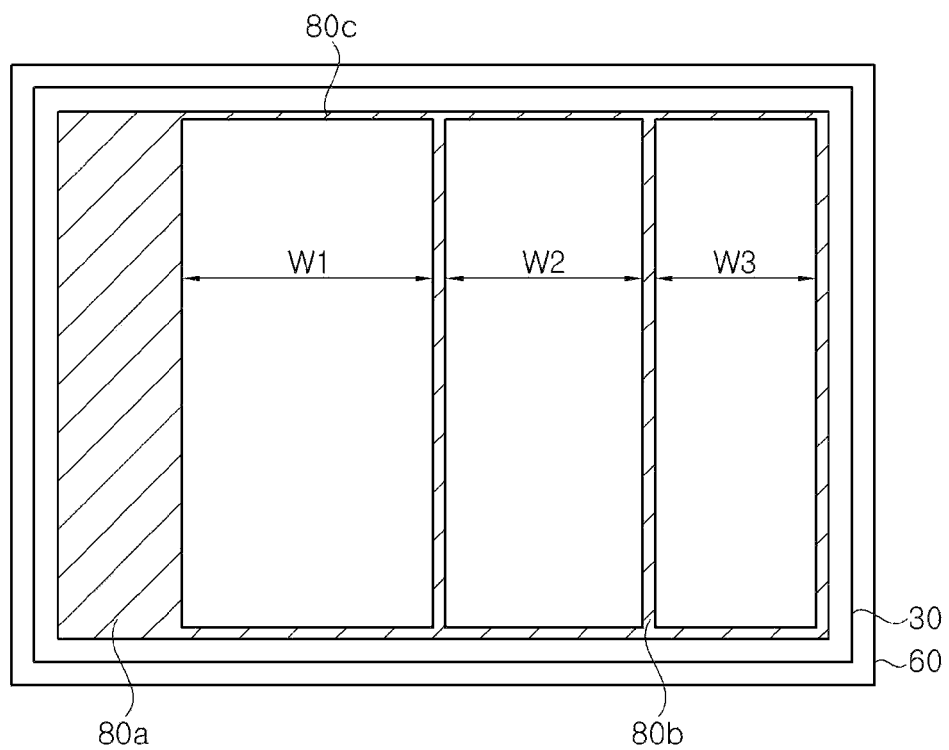
FIG. 5 is a schematic plan view of a light emitting diode according to an exemplary embodiment.

FIG. 5 is a schematic plan view of a light emitting diode according to an exemplary embodiment.

Referring to FIG. 5, although the luminous regions divided by the middle extension 80*c* or 180*c* are illustrated as having the same width in the light emitting diodes 100 and 101, the luminous regions may have different widths. For example, as shown in FIG. 5, the widths of the luminous regions may gradually increase with decreasing distance to the electrode pad 80*a* (e.g., W1>W2>W3). Alternatively, the widths of the luminous regions may gradually decrease with decreasing distance to the electrode pad 80*a*.

Figure 6:
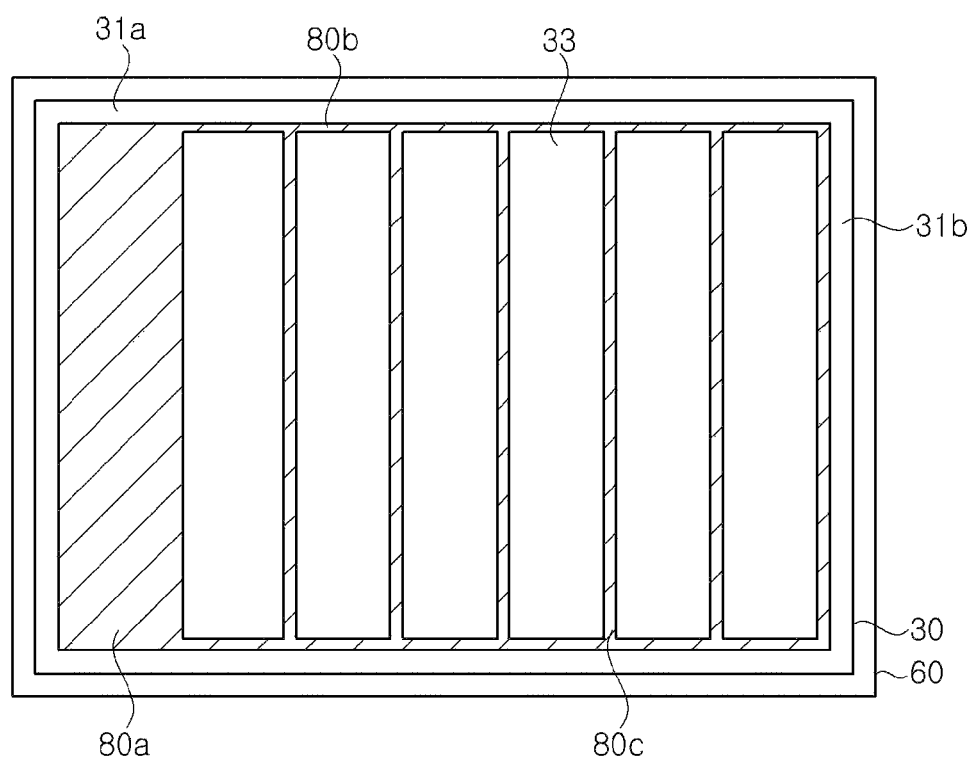
FIG. 6 is a schematic plan view of a light emitting diode according to an exemplary embodiment.

FIG. 6 is a schematic plan view of a light emitting diode according to an exemplary embodiment.

Referring to FIG. 6, although three luminous regions are illustrated in the above exemplary embodiments, the number of luminous regions is not particularly limited. That is, the number of luminous regions may be increased by increasing the number of middle extensions 80c. In addition, the luminous regions may have the same width or different widths.

Figure 7:
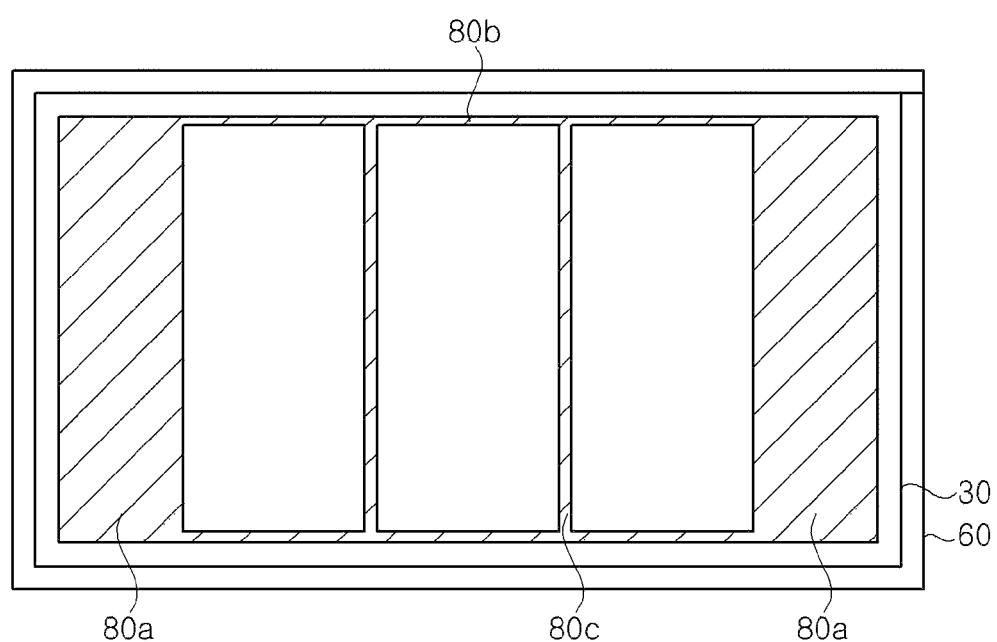
FIG. 7 is a schematic plan view of a light emitting diode according to an exemplary embodiment.

FIG. 7 is a schematic plan view of a light emitting diode according to an exemplary embodiment.

Referring to FIG. 7, although the electrode pad 80a or 180a is illustrated as being disposed along the one side of the upper semiconductor layer 23 in the above exemplary embodiments, the electrode pad 80a may be disposed at each side of the upper semiconductor layer 23. In this case, the wavelength converter 90 may be mounted to cover the luminous regions disposed between the electrode pads 80a.

Figure 8:
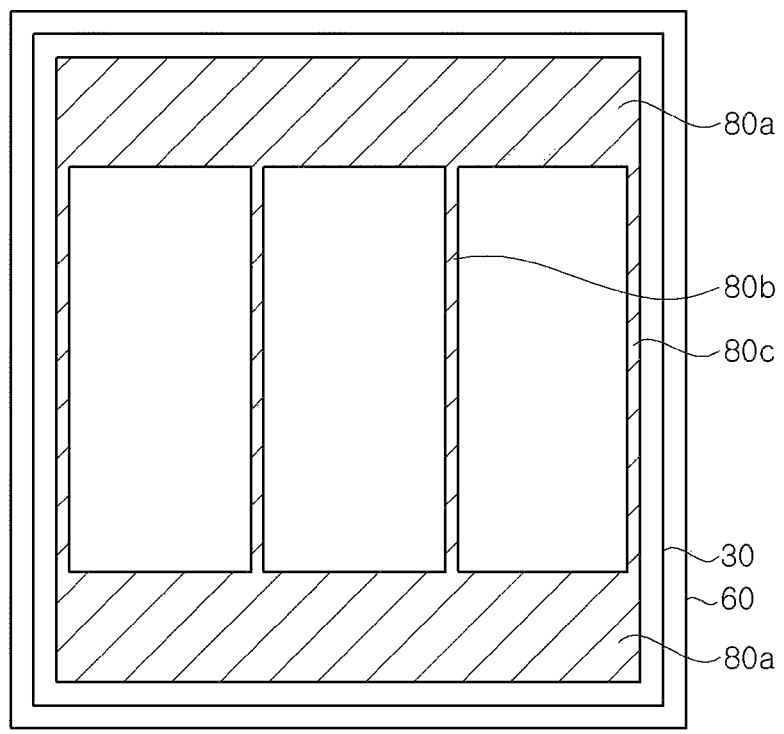
FIG. 8 is a schematic plan view of a light emitting diode according to an exemplary embodiment.

FIG. 8 is a schematic plan view of a light emitting diode according to an exemplary embodiment.

Referring to FIG. 8, although the middle extensions 80c are illustrated as extending from the edge extensions 80b and being parallel to the electrode pads 80a in the exemplary embodiment shown in FIG. 7, the middle extensions 80c may extend from the electrode pads 80a to be perpendicular to the electrode pads 80a.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A light emitting diode comprising:
    a semiconductor stack comprising a lower semiconductor layer, an active layer, and an upper semiconductor layer;
    an upper electrode connected to the upper semiconductor layer and comprising an electrode pad and extensions extending from the electrode pad; and
    a lower electrode connected to the lower semiconductor layer,
    wherein:
    the electrode pad comprises a first electrode pad having an elongated shape, disposed along a first side of the upper semiconductor layer, and covering the upper semiconductor layer near the first side of the upper semiconductor layer;
    the extensions comprise:
        an edge extension extending along an edge of the upper semiconductor layer in the electrode pad and surrounding a luminous region; and
        middle extensions extending from the edge extension or the electrode pad and dividing the luminous region into a plurality of luminous regions; and
    widths of the luminous regions divided by the middle extensions are different with increasing distance from the electrode pad.

2. The light emitting diode of claim 1, wherein the middle extensions are disposed in parallel to a longitudinal direction of the electrode pad.

3. The light emitting diode of claim 1, wherein the middle extensions are disposed perpendicular to a longitudinal direction of the electrode pad.

4. The light emitting diode of claim 1, further comprising an insulating layer covering a surface of the upper semiconductor layer.

5. The light emitting diode of claim 4, wherein the upper semiconductor layer comprises a roughened surface.

6. The light emitting diode of claim 1, further comprising a wavelength converter having a rectangular shape and covering the upper semiconductor layer and the extensions.

7. The light emitting diode of claim 6, wherein the wavelength converter is a phosphor-in-glass (PIG) wavelength converter.

8. The light emitting diode of claim 7, wherein the wavelength converter covers the luminous regions between the first electrode pad and a second side of the upper semiconductor layer opposing the first side.

9. The light emitting diode of claim 7, wherein the electrode pad further comprises a second electrode pad having an elongated shape, disposed along the second side of the upper semiconductor layer, and covering the upper semiconductor layer near the second side.

10. The light emitting diode of claim 9, wherein the wavelength converter covers the luminous regions between the first electrode pad and the second electrode pad.

11. A light emitting diode package comprising:
    a base substrate comprising a first electrode and a second electrode;
    a light emitting diode mounted on the base substrate and electrically connected to the first electrode and the second electrode;
    a wavelength converting layer mounted on the light emitting diode;
    a housing disposed on the base substrate and surrounding the light emitting diode; and
    an encapsulation portion covering the light emitting diode within the housing and exposing an upper surface of the wavelength converting layer,
    wherein:
    the light emitting diode comprises:
        a semiconductor stack comprising a lower semiconductor layer, an active layer, and an upper semiconductor layer; and
        an upper electrode connected to the upper semiconductor layer and comprising an electrode pad and extensions extending from the electrode pad; and
        a lower electrode connected to the lower semiconductor layer;
    the electrode pad comprises a first electrode pad having an elongated shape, disposed along a first side of the upper semiconductor layer, and covering the upper semiconductor layer near the first side of the upper semiconductor layer;
    the extensions comprise:
        an edge extension extending along an edge of the upper semiconductor layer in the electrode pad and surrounding a luminous region; and
        middle extensions extending from the edge extension or the electrode pad and dividing the luminous region into a plurality of luminous regions; and
    widths of the luminous regions divided by the middle extensions are different with increasing distance from the electrode pad.

12. The light emitting diode package of claim 11, wherein the wavelength converting layer comprises a phosphor-in-glass (PIG) wavelength converting layer having a rectangular shape.

13. The light emitting diode package of claim 11, wherein the encapsulation portion comprises a white reflector.

14. The light emitting diode package of claim 13, wherein the white reflector covers four side surfaces of the light emitting diode and the first electrode pad.

15. The light emitting diode package of claim 11, wherein:
the electrode pad further comprises a second electrode pad having an elongated shape, disposed along a second side of the upper semiconductor layer opposite to the first side, and covering the upper semiconductor layer near the second side; and
the white reflector covers the second electrode pad.

16. The light emitting diode package of claim 11, wherein the middle extensions are disposed in parallel to a longitudinal direction of the electrode pad.

17. The light emitting diode package of claim 11, wherein the middle extensions are disposed perpendicular to a longitudinal direction of the electrode pad.

18. The light emitting diode package of claim 11, wherein:
the base substrate comprises an aluminum nitride (AlN) ceramic substrate; and
the housing comprises a silicone molding compound.

19. The light emitting diode package of claim 11, wherein:
the light emitting diode is mounted on the first electrode; and
the first electrode pad of the light emitting diode is electrically connected to the second electrode through a plurality of bonding wires.

20. The light emitting diode package of claim 19, wherein portions of the first electrode pad bonded to each bonding wire have the same interval.

21. The light emitting diode package of claim 11, wherein the wavelength converting layer partially overlaps the light emitting diode.

22. The light emitting diode package of claim 21, wherein substantial portions of the electrode pad do not overlap the wavelength converting layer in plan view.

* * * * *